United States Patent
Cho et al.

(10) Patent No.: US 9,257,618 B2
(45) Date of Patent: Feb. 9, 2016

(54) LED PACKAGE AND METHOD OF MANUFACTURING THE SAME

(75) Inventors: Byoung gu Cho, Seoul (KR); Jae-Sik Min, Seoul (KR)

(73) Assignee: Lightizer Korea Inc., Seoul (KR)

( * ) Notice: Subject to any disclaimer, the term of this patent is extended or adjusted under 35 U.S.C. 154(b) by 298 days.

(21) Appl. No.: 13/342,653

(22) Filed: Jan. 3, 2012

(65) Prior Publication Data

US 2012/0292644 A1    Nov. 22, 2012

(30) Foreign Application Priority Data

May 20, 2011    (KR) .................. 10-2011-0048125

(51) Int. Cl.
| | | |
|---|---|---|
| *H01L 33/00* | (2010.01) | |
| *H01L 21/00* | (2006.01) | |
| *H01L 33/50* | (2010.01) | |
| *H01L 27/15* | (2006.01) | |
| *H01L 33/62* | (2010.01) | |
| *H01L 25/075* | (2006.01) | |

(52) U.S. Cl.
CPC ............ *H01L 33/505* (2013.01); *H01L 27/156* (2013.01); *H01L 33/507* (2013.01); *H01L 33/62* (2013.01); *H01L 25/0753* (2013.01); *H01L 33/502* (2013.01); *H01L 2924/0002* (2013.01); *H01L 2933/0033* (2013.01); *H01L 2933/0041* (2013.01)

(58) Field of Classification Search
USPC ................... 257/103, 13, 80, 90, 79
See application file for complete search history.

(56) References Cited

U.S. PATENT DOCUMENTS

| 7,573,071 | B2* | 8/2009 | Chang ............................ 257/81 |
|---|---|---|---|
| 7,655,486 | B2* | 2/2010 | Thompson et al. ............. 438/25 |
| 2004/0041222 | A1* | 3/2004 | Loh ............................... 257/433 |
| 2004/0217692 | A1* | 11/2004 | Cho et al. ...................... 313/503 |
| 2005/0156496 | A1* | 7/2005 | Takashima et al. ........... 313/237 |
| 2009/0051262 | A1* | 2/2009 | Minamoto et al. ........... 313/483 |
| 2010/0096977 | A1* | 4/2010 | Lee et al. ....................... 313/503 |
| 2010/0133554 | A1* | 6/2010 | Hussell ........................... 257/88 |
| 2012/0032219 | A1* | 2/2012 | Ooyabu et al. ................. 257/98 |
| 2012/0286301 | A1* | 11/2012 | Kobayakawa et al. .......... 257/88 |

\* cited by examiner

*Primary Examiner* — Mary Wilczewski
*Assistant Examiner* — Tsz Chiu
(74) *Attorney, Agent, or Firm* — Hunter E. Webb; Keohane & D'Alessandro PLLC

(57) ABSTRACT

The present invention provides a Light Emitting Diode (LED) package, comprising a Printed Circuit Board (PCB), an LED mounted on the PCB, a pillar placed higher than the LED around the LED on the PCB, a transparent plate disposed on the pillar, spaced apart from the LED, and configured to transmit light emitted from the LED, and a fluorescent layer formed on a surface of the transparent plate, facing the LED, and conformably coated with a substance for converting the light emitted from the LED into white light by changing a wavelength of the light, wherein an electrical pad of the LED and an electrical pad of the PCB are electrically connected to each other, and the LED and the fluorescent layer are spaced apart from each other.

24 Claims, 4 Drawing Sheets

| | LED Chip (wavelength) | Phosphor Ratio (Y:G:R) |
|---|---|---|
| 1 | α | A |
| 2 | β | B |
| 3 | γ | C |

LED PACKAGE AND METHOD OF MANUFACTURING THE SAME

CROSS-REFERENCE TO RELATED APPLICATIONS

The present application claims priority under 35 U.S.C. 119 and 35 U.S.C. 365 to Korean Patent Application No. 10-2011-0048125 filed on May 20, 2011, which is hereby incorporated by reference in its entirety.

FIELD OF THE INVENTION

The present invention relates to a Light-Emitting Diode (LED) package and a method of manufacturing the same and, more particularly, to an LED package of a Chip On Module (COM) form or a Chip On Board (COB) form using a Printed Circuit Board (PCB) and a method of manufacturing the same.

BACKGROUND OF THE RELATED ART

In general, an LED including an epitaxial layer made of GaN, InGaN, or AlGaN has excellent characteristics, a long life span, lower power consumption, higher brightness, and less harmless environmental factors, as compared with the existing incandescent. The LED is used in various fields, such as automotive lights, traffic signal lights, common lightings, and backlight units for liquid crystal displays, because of the advantages of the LED.

Meanwhile, the LED is fabricated by coating a fluorescent substance, designed according to the wavelength of an LED chip, on a surface of the LED chip using a method, such as dispensing, in order to form white light.

The LED on which the fluorescent substance is coated, however, is problematic in that the LED is deteriorated by heat generated therein.

SUMMARY OF THE INVENTION

Accordingly, the present invention has been made in view of the above problems occurring in the prior art, and it is an object of the present invention to provide an LED package which is capable of effectively inhibiting a fluorescent layer from being deteriorated by heat generated from an LED.

It is another object of the present invention to provide a method of manufacturing an LED package, which can easily fabricate the LED package.

The technical objects to be achieved by the present invention are not limited to the above-mentioned objects, and other technical objects that have not been mentioned above will become evident to those skilled in the art from the following description.

To achieve the above objects, an LED package according to an embodiment of the present invention includes a PCB, an LED mounted on the PCB, a pillar placed higher than the LED around the LED on the PCB, a transparent plate disposed on the pillar, spaced apart from the LED, and configured to transmit light emitted from the LED, and a fluorescent layer formed on a surface of the transparent plate, facing the LED, and conformably coated with a substance for converting the light emitted from the LED into white light by changing a wavelength of the light, wherein the electrical pad of the LED and the electrical pad of the PCB are electrically connected to each other, and the LED and the fluorescent layer are spaced apart from each other.

An LED package according to another embodiment of the present invention includes a PCB, a first LED mounted on the PCB, a second LED mounted on the PCB and spaced apart from the first LED, a pillar placed higher than the first LED and the second LED around the first LED and the second LED on the PCB, a transparent plate disposed on the pillar, spaced apart from the first LED and the second LED, and configured to transmit light emitted from the first LED or the second LED, and a fluorescent layer formed on a surface of the transparent plate, facing the first LED and the second LED, and conformably coated with a substance for converting the light emitted from the first LED or the second LED into white light by changing a wavelength of the light, wherein the electrical pad of the first LED and the electrical pad of the PCB are electrically connected to each other, the electrical pad of the second LED and the electrical pad of the PCB are electrically connected to each other, and the first and second LEDs and the fluorescent layer are spaced apart from each other.

An LED package according to another embodiment of the present invention includes a PCB, a first LED mounted on the PCB, a second LED mounted on the PCB and spaced apart from the first LED, a pillar placed higher than the first LED and the second LED around the first LED and the second LED on the PCB, a transparent plate disposed on the pillar, spaced apart from the first LED and the second LED, and configured to transmit light emitted from the first LED or the second LED, a first fluorescent layer formed on a surface of the transparent plate, facing the first LED and the second LED, and conformably coated with a substance for converting the light emitted from the first LED into white light by changing a wavelength of the light, and a second fluorescent layer formed on the surface of the transparent plate, facing the first LED and the second LED, and conformably coated with a substance for converting the light, emitted from the second LED, into white light by changing a wavelength of the light, wherein the electrical pad of the first LED and the electrical pad of the PCB are electrically connected to each other, the electrical pad of the second LED and the electrical pad of the PCB are electrically connected to each other, the first LED and the first fluorescent layer are spaced apart from each other, the second LED and the second fluorescent layer are spaced apart from each other, and the first fluorescent layer and the second fluorescent layer are coated with them spaced apart from each other.

A method of manufacturing an LED package according to an embodiment of the present invention includes the steps of mounting an LED on a PCB, having a pillar formed thereon, within the pillar, electrically connecting the electrical pad of the PCB and the electrical pad of the LED, disposing a transparent plate configured to include a fluorescent layer conformably coated with a substance for converting light emitted from the LED into white light by changing a wavelength of the light, and to transmit the light emitted from the LED, on the pillar so that the fluorescent layer faces the LED, and attaching the transparent plate to the pillar.

A method of manufacturing an LED package according to another embodiment of the present invention includes the steps of mounting an LED on a PCB, having a pillar formed thereon, within the pillar, electrically connecting the electrical pad of the PCB and the electrical pad of the LED, disposing a transparent plate configured to include a fluorescent layer conformably coated with a substance for converting light emitted from the LED into white light by changing a wavelength of the light, and to transmit the light emitted from the LED, on the pillar so that the fluorescent layer faces the LED, measuring a wavelength of the light, emitted from the LED, after the light passes through the transparent plate, checking whether the light passing through the transparent plate satisfies a specific criterion, and if, as a result of the check, the light passing through the transparent plate satisfies the specific criterion, attaching the transparent plate to the pillar.

BRIEF DESCRIPTION OF THE DRAWINGS

Further objects and advantages of the invention can be more fully understood from the following detailed description taken in conjunction with the accompanying drawings in which.

DETAILED DESCRIPTION OF EMBODIMENTS

Figure 1:
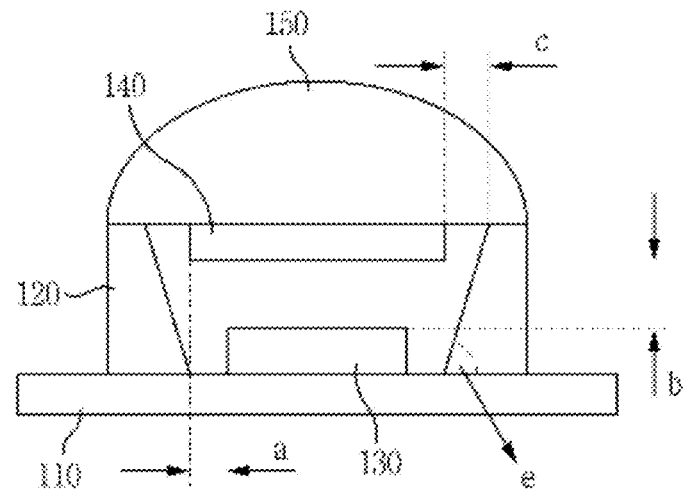
FIG. 1 is a cross-sectional view of an LED package according to a first embodiment of the present invention.

Some exemplary embodiments of the present invention will now be described in detail with reference to the accompanying drawings. The detailed contents of other embodiments are included in the detailed description and drawings. Merits and characteristics of the present invention and methods for achieving them will become more apparent from the following embodiments taken in conjunction with the accompanying drawings. The same reference numerals are used throughout the entire specification to refer to the same parts.

Figure 2:
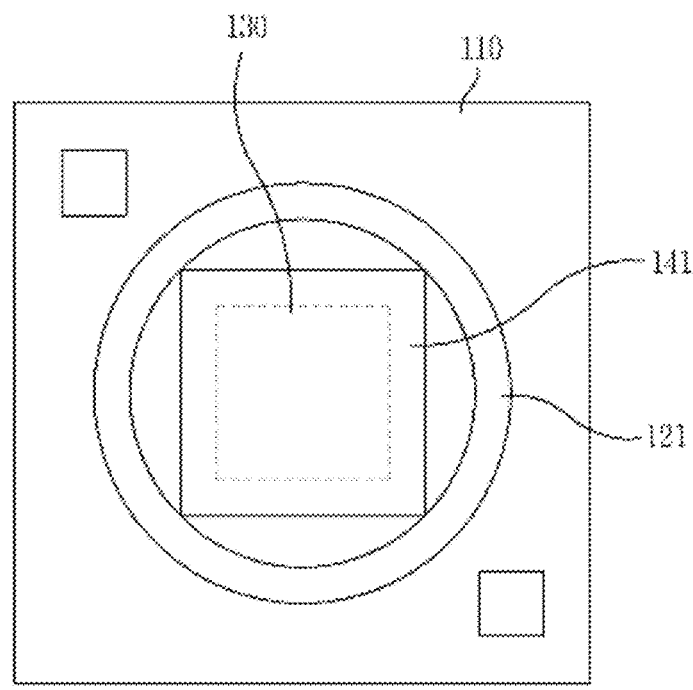
FIG. 2 is a plan view of a modified embodiment of FIG. 1.
Figure 3:
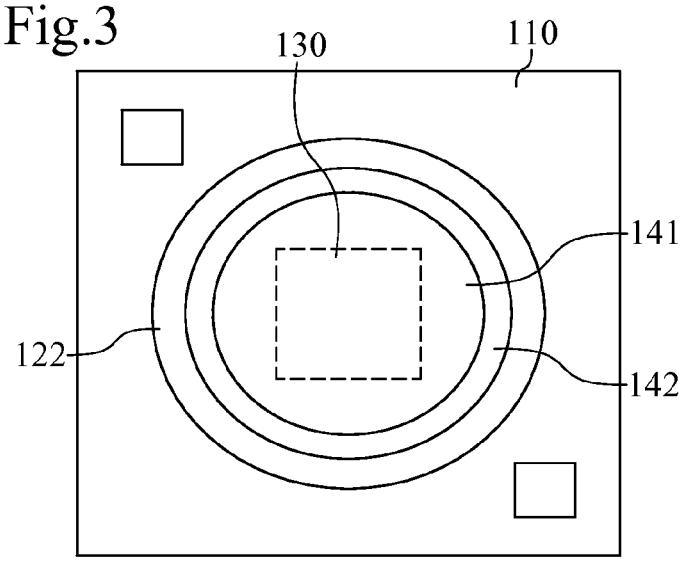
FIG. 3 is a plan view of a modified embodiment of FIG. 1.
Figure 4:
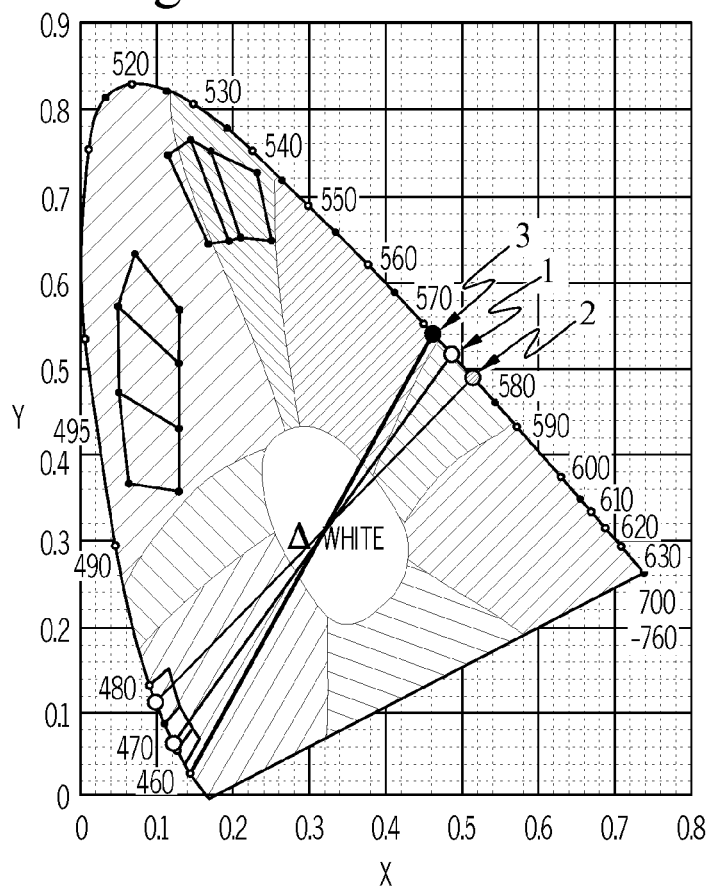
FIG. 4 shows a combination ratio according to color coordinates and the scattering of wavelengths.

FIG. 1 is cross-sectional view of an LED package according to a first embodiment of the invention, FIG. 2 is a plan view of a modified embodiment of FIG. 1, FIG. 3 is a plan view of a modified embodiment of FIG. 1, and FIG. 4 shows a combination ratio according to color coordinates and the scattering of wavelengths.

The LED package according to the first embodiment of the present invention may include a PCB 110, an LED 130, a pillar 120, a transparent plate 150, and a fluorescent layer 140.

The LED 130 is mounted on the PCB 110. The electrical pad of the LED 130 and the electrical pad of the PCB 110 are electrically connected to each other.

The pillar 120 is placed higher than the LED 130 around the LED 130 on the PCB 110. Light generated from the LED 130 is reflected from the pillar 120 in the direction of the LED 130 when the light comes in contact with the pillar 120.

When the pillar 120 reflects the light from the LED 130 in the direction of the LED 130, the light emitted from the LED 130 can be effectively inhibited from leaking outside without passing through the fluorescent layer 140.

The pillar 120 may have a side facing the LED 130 at a specific angle. More particularly, the side of the pillar 120 facing the LED 130 may be an angle of 15° to 90° to the PCB 110.

When the side of the pillar 120 facing the LED 130 is formed at a specific angle, the light emitted from the LED 130 can be more effectively inhibited from leaking outside without passing through the fluorescent layer 140.

Meanwhile, the pillar 120 may be integrally formed with the PCB 110. Alternatively, the pillar 120 may be fabricated separately from the PCB 110 and attached on the PCB 110. The pillar 120 may be formed in a ring shape or in various forms, such as a square belt form, as shown in FIGS. 2 and 3.

The transparent plate 150 is disposed on the pillar 120 with it spaced apart from the LED 130. The transparent plate 150 transmits light emitted from the LED 130. The transparent plate 150 may be formed of a lens or a transparent substrate made of glass or polymer.

The fluorescent layer 140 is conformably coated with a substance for converting light, emitted from the LED 130, into white light by changing a wavelength of the light and is formed on a surface of the transparent plate 150 which faces the LED 130. The LED 130 and the fluorescent layer 140 are spaced apart from each other. More particularly, the distance between the fluorescent layer 140 and the LED 130 is 10 to 20,000 μm. The LED 130 is disposed within an area corresponding to the fluorescent layer 140 at a distance of about 0 to 500 μm from the fluorescent layer 140. The pillar 120 is disposed at a distance of about 0 to 500 μm from the fluorescent layer 140.

Since the LED 130 and the fluorescent layer 140 are spaced apart from each other, the deterioration of the fluorescent layer 140 due to heat generated from the LED 130 can be effectively inhibited. Accordingly, a reduction in the light efficiency of the LED 130 can be minimized although the turn-on time of the LED 130 elapses.

The fluorescent layer 140 includes silicon. In order to compensate for the scattering of a wavelength of light emitted from the LED 130, a combination ratio of silicon included in the fluorescent layer 140 or the thickness of the fluorescent layer 140 may be controlled.

For example, as shown in FIG. 4, if a color coordinate system of light emitted from the LED 130 is No. 1, a silicon combination ratio A may be used. If a color coordinate system of light emitted from the LED 130 is No. 2, a silicon combination ratio B may be used. If a color coordinate system of light emitted from the LED 130 is No. 3, a silicon combination ratio C may be used.

Meanwhile, the fluorescent layer 140 may have a circle as shown in FIG. 2, a square as shown in FIG. 3, or various forms.

An LED package according to a second embodiment of the present invention is described below, and a difference between the LED packages according to the first and second embodiments is chiefly described.

Figure 5:
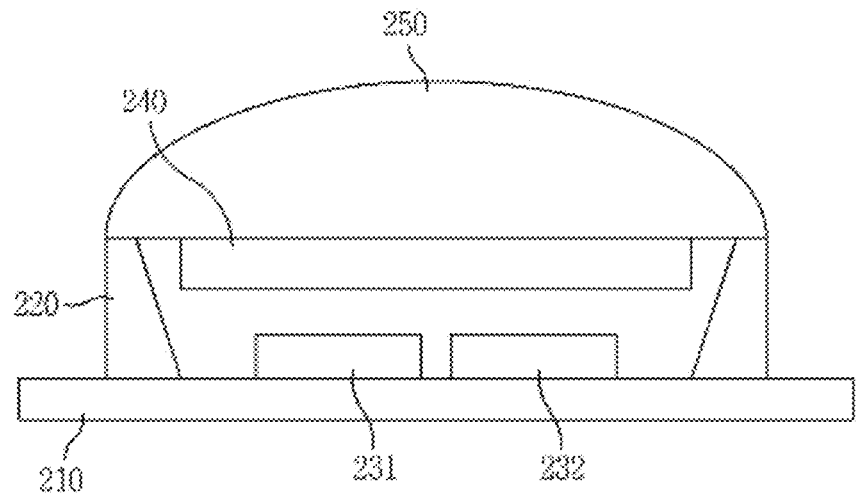
FIG. 5 is a cross-sectional view of an LED package according to an embodiment of the present invention.
Figure 6:
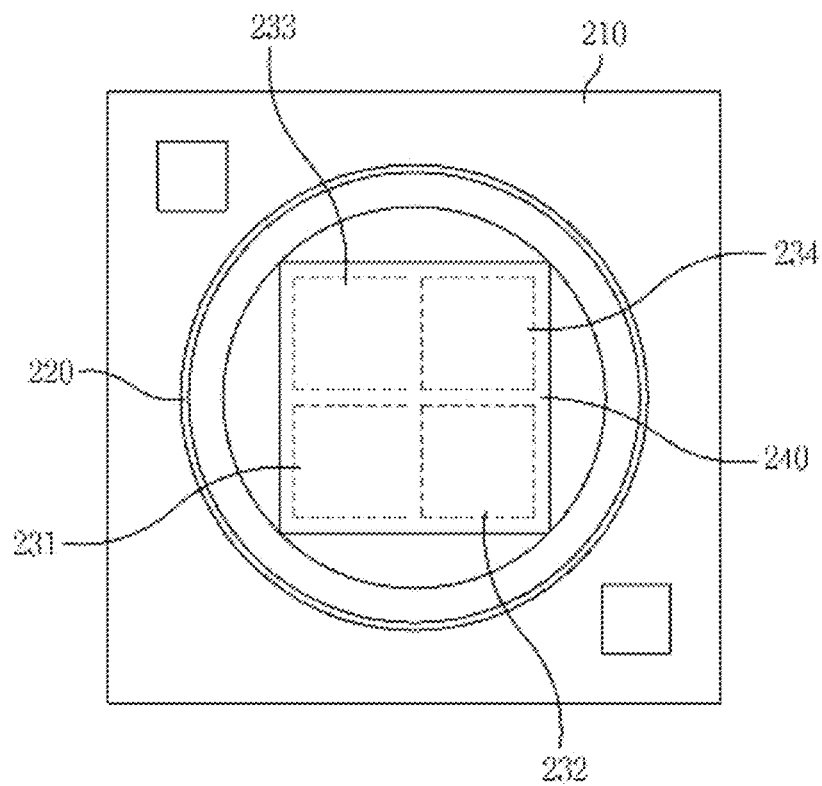
FIG. 6 is a plan view of a modified embodiment of FIG. 5.

FIG. 5 is a cross-sectional view of the LED package according to the second embodiment of the present invention, and FIG. 6 is a plan view of a modified embodiment of FIG. 5.

The LED package according to the second embodiment of the present invention includes a first LED 231 mounted on a PCB 210, a second LED 232 mounted on the PCB 210 and spaced apart from the first LED 231, and a fluorescent layer 240 conformably coated with a substance for converting light, emitted from the first LED 231 or the second LED 232, into white light by changing a wavelength of the light and formed on a surface of a transparent plate 250 which faces the first LED 231 and the second LED 232. The first LED 231, the second LED 232, and the fluorescent layer 240 are disposed and spaced apart from one another.

The LED package according to the second embodiment of the present invention includes the plurality of LEDs within an area corresponding to the one fluorescent layer 240. An LED package according to a modified embodiment may include four LEDs 231, 232, 233, and 234, as shown in FIG. 6.

An LED package according to a third embodiment of the present invention is described below, and a difference between the LEDs according to the first and third embodiments is chiefly described.

Figure 7:
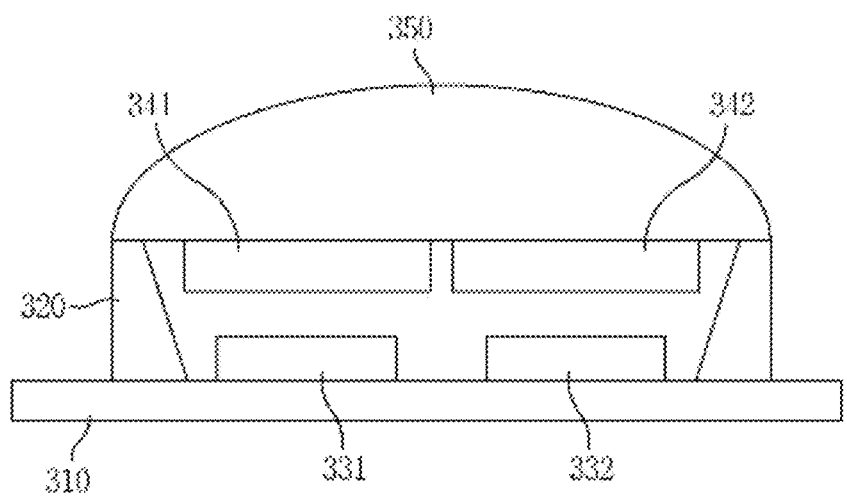
FIG. 7 a cross-sectional view of an LED package according to an embodiment of the present invention.
Figure 8:
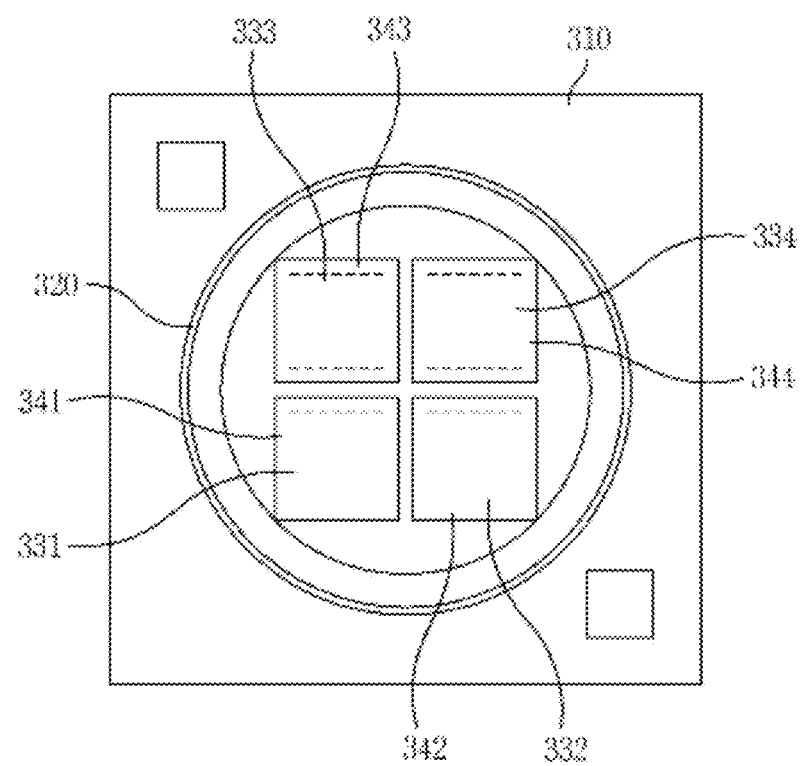
FIG. 8 is a plan view of a modified embodiment of FIG. 7.

FIG. 7 is a cross-sectional view of the LED package according to the third embodiment of the present invention, and FIG. 8 is a plan view of a modified embodiment of FIG. 7.

The LED package according to the third embodiment of the present invention includes a first LED 331 mounted on a PCB 310, a second LED 332 mounted on the PCB 310 and spaced apart from the first LED 331, a first fluorescent layer 341 conformably coated with a substance for converting light emitted from the first LED 331 into white light by changing a wavelength of the light, and a second fluorescent layer 342 conformably coated with a substance for converting light emitted from the second LED 332 into white light by changing a wavelength of the light. Here, the first fluorescent layer 341 is formed on a surface of the transparent plate 350 which faces the first LED 331 and the second LED 332. Furthermore, the second fluorescent layer 342 is formed on a surface of the transparent plate 350 which faces the first LED 331 and the second LED 332. The first LED 331 and the first fluorescent layer 341 are spaced apart from each other, and the second LED 332 and the second fluorescent layer 342 are spaced apart from each other. Furthermore, the first fluorescent layer 341 and the second fluorescent layer 342 are spaced apart from each other.

The LED package according to the third embodiment of the present invention includes the plurality of fluorescent layers 341 and 342 and the plurality of LEDs 331 and 332, corresponding to the respective fluorescent layers 341 and 342, within one pillar 120. An LED package according to a modified embodiment includes four fluorescent layers 341, 342, 343, and 344 and four LEDs 331, 332, 333, and 334 corresponding to the four fluorescent layers, respectively, as shown in FIG. 8.

A method of manufacturing the LED according to an embodiment of the present invention is described below with reference to FIG. 1, for example.

The LED 130 is mounted on the PCB 110, having the pillar 120 formed thereon, within the pillar 120. Next, the electrical pad of the PCB 110 and the electrical pad of the LED 130 are electrically connected to each other. The transparent plate 150 is configured to include the fluorescent layer 140 conformably coated with the substance for converting light emitted from the LED 130 into white light by changing a wavelength of the light, and to transmit the light emitted from the LED 130, and is disposed on the pillar 120 so that the fluorescent layer 140 faces the LED 130. After the transparent plate 150 transmits the light emitted from the LED 130, a wavelength of light is measured.

Next, it is checked whether the light passing through the transparent plate 150 satisfies a specific criterion. Need an example? If, as a result of the check, the light passing through the transparent plate 150 satisfies the specific criterion, the transparent plate 150 is attached to the pillar 120.

As described above, the embodiments of the present invention provide the LED package capable of effectively inhibiting the fluorescent layer from be deteriorated by heat generated from the LED.

Furthermore, the LED package may be easily fabricated using the method of manufacturing the LED package according to the embodiments of the present invention.

While the some exemplary embodiments of the present invention have been described and shown in order to illustrate the principle of the present invention, the present invention is not to be restricted by the constructions and operations shown and described above. It is to be appreciated that those skilled in the art may change or modify the embodiments without departing from the scope and spirit of the present invention. Accordingly, it should be construed that all proper modification and changes and their equivalents fall within the scope of the present invention.

What is claimed is:

1. A Light Emitting Diode (LED) package, comprising:
a Printed Circuit Board (PCB);
an LED mounted on the PCB;
a set of pillars placed higher than the LED around the LED on the PCB;
a transparent plate having a bottom surface, facing the LED, disposed on a surface of the set of pillars that is highest with respect to the LED such that an entirety of a region over the LED within the set of pillars is bridged and an unfilled cavity is formed between an upper surface of the LED and the bottom surface of the transparent plate and configured to transmit light emitted from the LED; and
a fluorescent layer formed on the bottom surface of the transparent plate, facing the LED, and conformably coated with a substance for converting the light emitted from the LED into white light by changing a wavelength of the light, wherein the florescent layer does not abut the LED and does not extend laterally beyond a base of a set of sidewall of the pillar abutting the PCB, and
wherein an electrical pad of the LED and an electrical pad of the PCB are electrically connected to each other, and the LED and the fluorescent layer are spaced apart from each other.

2. The LED package as claimed in claim 1, wherein the LED is disposed within an area corresponding to the fluorescent layer.

3. The LED package as claimed in claim 1, wherein the fluorescent layer includes silicon.

4. The LED package as claimed in claim 1, wherein the pillar reflects the light emitted from the LED in a direction of the LED when the light comes in contact with the pillar.

5. The LED package as claimed in claim 1, wherein a face of the pillar, facing the LED, is formed at a specific angle.

6. The LED package as claimed in claim 5, wherein the face of the pillar, facing the LED, is formed at an angle of about 15° to 90° to the PCB.

7. The LED package as claimed in claim 1, wherein the transparent plate is formed of a lens or a transparent substrate.

8. The LED package as claimed in claim 1, wherein a distance between the fluorescent layer and the LED is about 10 to 20,000 μm.

9. A Light Emitting Diode (LED) package, comprising:
a Printed Circuit Board (PCB);
a first LED mounted on the PCB;
a second LED mounted on the PCB and spaced apart from the first LED;
a set of pillars placed higher than the first LED and the second LED around the first LED and the second LED on the PCB;
a transparent plate having a bottom surface, facing the LED, disposed on a surface of the set of pillars that is highest with respect to the LED such that an entirety of a region over the LED within the set of pillars is bridged and an unfilled cavity is formed between an upper surface of the LED and the bottom surface of the transparent plate and configured to transmit light emitted from the LED; and a fluorescent layer formed on the bottom surface of the transparent plate, facing the first LED and the second LED, and conformably coated with a substance for converting the light emitted from the first LED or the second LED into white light by changing a wavelength of the light, wherein the florescent layer does not abut the LED and does not extend laterally beyond a base of a set of sidewall faces of the pillar abutting the PCB, and wherein an electrical pad of the first LED and an electrical pad of the PCB are electrically connected to each other, an electrical pad of the second LED and an electrical pad of the PCB are electrically connected to each other, and the first and second LEDs and the fluorescent layer are spaced apart from each other.

10. The LED package as claimed in claim 9, wherein the first LED and the second LED are disposed within an area corresponding to the fluorescent layer.

11. The LED package as claimed in claim 9, wherein the fluorescent layer includes silicon.

12. The LED package as claimed in claim 9, wherein the pillar reflects the light of the first LED or the second LED in a direction of the first LED or the second LED when the light comes in contact with the pillar.

13. The LED package as claimed in claim 9, wherein a face of the pillar, facing the first LED and the second LED, is formed at a specific angle.

14. The LED package as claimed in claim 13, wherein the face of the pillar, facing the first LED and the second LED, is formed at an angle of about 15° to 90° to the PCB.

15. The LED package as claimed in claim 9, wherein the transparent plate is formed of a lens or a transparent substrate.

16. The LED package as claimed in claim 9, wherein a distance between the fluorescent layer and the first LED and the second LED is about 10 to 20,000 μm.

17. A Light Emitting Diode (LED) package, comprising:
a Printed Circuit Board (PCB);
a first LED mounted on the PCB;
a second LED mounted on the PCB and spaced apart from the first LED;
a set of pillars placed higher than the first LED and the second LED around the first LED and the second LED on the PCB;
a transparent plate having a bottom surface, facing the LED, disposed on a surface of the set of pillars that is highest with respect to the LED such that an entirety of a region over the LED within the set of pillars is bridged and an unfilled cavity is formed between an upper surface of the LED and the bottom surface of the transparent plate and configured to transmit light emitted from the LED;

a first fluorescent layer formed on the bottom surface of the transparent plate, facing the first LED and the second LED, and conformably coated with a substance for converting the light emitted from the first LED into white light by changing a wavelength of the light; and a second fluorescent layer formed on the surface of the transparent plate, facing the first LED and the second LED, and conformably coated with a substance for converting the light emitted from the second LED into white light by changing a wavelength of the light, wherein the first florescent layer and the second florescent layers do not abut the LED and do not extend laterally beyond a base of a set of sidewall faces of the pillar abutting the PCB;

wherein an electrical pad of the first LED and an electrical pad of the PCB are electrically connected to each other, an electrical pad of the second LED and the electrical pad of the PCB are electrically connected to each other, the first LED and the first fluorescent layer are spaced apart from each other, the second LED and the second fluorescent layer are spaced apart from each other, and the first fluorescent layer and the second fluorescent layer are spaced apart from each other.

18. The LED package as claimed in claim 17, wherein:
the first LED is disposed within an area corresponding to the first fluorescent layer; and
the second LED is disposed within an area corresponding to the second fluorescent layer.

19. The LED package as claimed in claim 17, wherein the first fluorescent layer or the second fluorescent layer includes silicon.

20. The LED package as claimed in claim 17, wherein the pillar reflects the light of the first LED or the second LED in a direction of the first LED or the second LED when the light comes in contact with the pillar.

21. The LED package as claimed in claim 17, wherein a face of the pillar, facing the first LED and the second LED, is formed at a specific angle.

22. The LED package as claimed in claim 21, wherein the face of the pillar, facing the first LED and the second LED, is formed at an angle of about 15° to 90° to the PCB.

23. The LED package as claimed in claim 17, wherein the transparent plate is formed of a lens or a transparent substrate.

24. The LED package as claimed in claim 17, wherein a distance between the first fluorescent layer and the first LED or a distance between the second fluorescent layer and the second LED is about 10 to 20,000 μm.

* * * * *